United States Patent [19]
Prammer

[11] Patent Number: 6,107,796
[45] Date of Patent: Aug. 22, 2000

[54] METHOD AND APPARATUS FOR DIFFERENTIATING OIL BASED MUD FILTRATE FROM CONNATE OIL

[75] Inventor: Manfred G. Prammer, Downingtown, Pa.

[73] Assignee: Numar Corporation, Malvern, Pa.

[21] Appl. No.: 09/136,009

[22] Filed: Aug. 17, 1998

[51] Int. Cl.$^7$ .................................................. G01V 3/00
[52] U.S. Cl. ........................................................ 324/303
[58] Field of Search ................................ 324/303, 300, 324/307, 309, 314

[56] References Cited

U.S. PATENT DOCUMENTS

| | | | |
|---|---|---|---|
| 3,508,438 | 4/1970 | Alger et al. | 73/152 |
| 4,710,713 | 12/1987 | Taicher et al. | 324/303 |
| 4,717,876 | 1/1988 | Masi et al. | 324/303 |
| 4,717,877 | 1/1988 | Taicher et al. | 324/303 |
| 4,717,878 | 1/1988 | Taicher et al. | 324/303 |
| 4,728,892 | 3/1988 | Vinegar et al. | 324/309 |
| 4,885,540 | 12/1989 | Snoddy et al. | 324/318 |
| 4,933,638 | 6/1990 | Kenyon et al. | 324/303 |
| 5,023,551 | 6/1991 | Kleinberg et al. | 324/303 |
| 5,212,447 | 5/1993 | Paltiel | 324/300 |
| 5,280,243 | 1/1994 | Miller | 324/303 |
| 5,309,098 | 5/1994 | Coates et al. | 324/303 |
| 5,349,184 | 9/1994 | Wraight | 250/266 |
| 5,350,925 | 9/1994 | Watson | 250/269.3 |
| 5,363,041 | 11/1994 | Sezginer | 324/303 |
| 5,376,884 | 12/1994 | Sezginer | 324/303 |
| 5,379,216 | 1/1995 | Head | 364/422 |
| 5,381,092 | 1/1995 | Freedman | 324/303 |
| 5,387,865 | 2/1995 | Jerosch-Herold et al. | 324/303 |
| 5,412,320 | 5/1995 | Coates | 324/303 |
| 5,432,446 | 7/1995 | Macinnis et al. | 324/303 |
| 5,486,761 | 1/1996 | Sezginer | 324/303 |
| 5,486,762 | 1/1996 | Freedman et al. | 324/303 |
| 5,497,087 | 3/1996 | Vinegar et al. | 324/303 |
| 5,498,960 | 3/1996 | Vinegar et al. | 324/303 |
| 5,517,115 | 5/1996 | Prammer | 324/303 |
| 5,557,200 | 9/1996 | Coates | 324/303 |
| 5,557,201 | 9/1996 | Kleinberg et al. | 324/303 |
| 5,565,775 | 10/1996 | Stallmach et al. | 324/303 |
| 5,680,043 | 10/1997 | Hurlimann et al. | 324/303 |
| 5,796,252 | 8/1998 | Kleinberg et al. | 324/303 |
| 5,936,405 | 8/1999 | Prammer et al. | 324/303 |

FOREIGN PATENT DOCUMENTS

| | | | |
|---|---|---|---|
| 0 581 666 A3 | 2/1994 | European Pat. Off. | G01V 3/32 |
| 0 649 035 B1 | 4/1995 | European Pat. Off. | G01V 3/32 |

OTHER PUBLICATIONS

International Publication No. WO 98/25164, Publication Date Jun. 11, 1998; from International Application No. PCT/US97/21889, Filed Nov. 26, 1997; Priority Data: Serial No. 08/759,829, File Dec. 4, 1996.

Morriss et al., "Hydrocarbon Saturation and Viscosity Estimation from NMR Logging in the belridge Diatomite," 35th SPWLA Annual Logging Symposium (Jun. 19–22, 1994), pp. 1–24.

Carr et al., "Effects of Diffusion on Free Precision in Nuclear Magnetic Resonance Experiments," *Physical Review*, vol. 94, No. 3 (May 1, 1954), pp. 630–638.

(List continued on next page.)

*Primary Examiner*—Louis Arana
*Attorney, Agent, or Firm*—Pennie & Edmonds LLP

[57] ABSTRACT

A method and apparatus for processing nuclear magnetic resonance (NMR) information to differentiate between oil based mud filtrate (OBM), and connate oils, during subsurface exploration. An NMR experiment is performed on a sample of formation fluid, and the resulting data is then processed to differentiate between the relaxation time parameters characteristic of OBMs and those characteristic of connate oils. A simple arithmetic difference between relaxation times calculated for successive samples may be followed by a distributional analysis performed in either the time domain or relaxation spectrum domain. The process is repeated for other fluid samples and the data for successive fluid samples is compared so that the user may determine when the formation fluid consists almost entirely of connate oil.

34 Claims, 7 Drawing Sheets

OTHER PUBLICATIONS

*Schlumberger Wireline & Testing,* "Combinable Magnetic Resonance tool reliably indicates water–free production and reveals hard–to–find pay zones," (Jun. 1995).

Morriss et al., "Field Test of an Experimental Pulsed Nuclear Magnetism Tool," SPWLA Annual Logging Symposium (Jun. 13–16, 1993), pp. 1–23.

Coates et al., "Core Data and the MRIL Show—A New Approach to 'Formation Factor,'" National SPWLA Convention (Jun. 15, 1992), pp. 1–15.

Kleinberg et al., "Novel NMR Apparatus for Investigating an External Sample," *Journal of Magnetic Resonance,* (1992) pp. 466–485.

Coates et al., "An Investigation of a New Magnetic Resoance Imaging Log," National SPWLA Convention (Jun. 18, 1991), pp. 1–24.

Howard et al., "Proton Magnetic Resonance and Pore–Size Variations in Reservoir Sandstones," *Society of Petroleum Engineers* (1990), pp. 733–741.

Miller et al., "Spin Echo Magnetic Resonance Logging: Porosity and Free Fluid Index Determination," *Society of Petroleum Engineers* (1990), pp. 321–334.

Kenyon et al., "Pore–Size Distribution and NMR in Microporous Cherty Sandstones," SPWLA Thirtieth Annual Logging Symposium (Jun. 11–14, 1989), pp. 1–24.

*Schlumberger Technology News—Oilfield Bulletin,* "Fifth Generation Nuclear Magnetic Resonance Logging Tool: A Major Advance in Producibility Measurement Technology," (Jul. 1995) (2 pp.).

Akkurt et al., "NMR Logging of Natural Gas Reservoirs," SPWLA 35th Annual Logging Symposium (Jun. 26–29, 1995).

Prammer, M.G., "NMR Pore Size Distributions and Permeability at the Well Site,", *Society of Petroleum Engineers* (Sep. 25, 1995) pp. 55–64.

Chandler et al., "Improved Log Quality with a Dual–Frequency Pulsed NMR Tool," *Society of Petroleum Engineers* (1994) pp. 23–35.

Straley et al., "NMR in Partially Saturated Rocks: Lagoratory Insights on Free Fluid Index and Comparison with Borehole Logs," SPWLA Annual Logging Symposium (Jun. 37, 1991) pp. 40–56.

Jackson et al., "Western Gas Sands Project Los Alamos NMR Well Logging Tool Development," Los Alamos National Laboratory (Oct. 1981–Sep. 1982) pp. 1–28.

Clavier et al., "The Theoretical and Experimental Bases for the 'Dual Water' Model for the Interpretation of Shaly Sands," *Journal of Petroleum Technology* (Apr. 1984), pp. 3–15.

Waxman et al., "Electrical Conductivities in Oil–Bearing Shaly Sands," *Society of Petroleum Engineers Journal* (1968) pp. 107–122.

METHOD AND APPARATUS FOR DIFFERENTIATING OIL BASED MUD FILTRATE FROM CONNATE OIL

FIELD OF THE INVENTION

The present invention relates generally to the use of nuclear magnetic resonance (NMR) technology in subsurface exploration, and more particularly to a method and apparatus for processing NMR signals during formation sampling to differentiate between synthetic drilling fluids and connate oils.

BACKGROUND OF THE INVENTION

Performing measurements on fluid samples is desirable in many oil industry applications. In the prior art, such measurements are typically made by bringing samples to the surface using sealed containers, and sending the samples for laboratory measurements. A number of technical and practical limitations are associated with this approach.

The main concern usually is that the sample(s) taken to the surface may not be representative of the downhole geologic formation due to the fact that only a limited number of samples can be extracted and taken to the surface. In addition, because these samples frequently contain highly flammable hydrocarbon mixtures under pressure, handling of such test samples can be both hazardous and costly.

Nuclear magnetic resonance (NMR) technology has alleviated some of these problems by enabling a user to determine many properties of an in-situ formation fluid without extracting numerous samples. These properties include hydrogen density, self-diffusivity, and relaxation times, $T_1$ and $T_2$. The use of NMR measurements to determine formation properties is known in the field. For example, in U.S. patent application Ser. No. 08/996,716, filed Dec. 23, 1997, by the inventor of the present invention, a method and apparatus for making direct downhole NMR measurements of formation fluids is disclosed. The apparatus of the referenced disclosure is a downhole formation tester capable of providing NMR measurements such as hydrogen density, self-diffusivity, and relaxation times.

One problem not solved by the prior art is borne from the use of oil-based drilling muds (OBMs). The OBM filtrate that invades a drilled formation consists almost entirely of the continuous phase of the OBM. This synthetic or highly refined base oil cannot be reliably differentiated from the connate oil stored in the formation by conventional measurements—resistance, dielectric constant, and viscosity. In certain cases it is impossible to determine at what point the fluid pumped out by a downhole formation tester changes from OBM filtrate to crude oil. Collecting a sample of OBM filtrate is at best useless and at worst misleading about the hydrocarbon contents of a formation. It is therefore apparent that there is a need for a reliable and efficient method for differentiating between OBM filtrate and connate oil, a method that will enable the user to minimize costly surface extractions by employing the existing downhole NMR measurement technology.

The present method is based, in part, on the use of the equipment, described briefly above, disclosed by T. Blades and M. Prammer in U.S. patent application Ser. No. 08/996,716, filed Dec. 23, 1997. The disclosed device is a nuclear magnetic resonance (NMR) module fitted onto a modular formation tester. It uses small samples of the pumped fluid to determine parameters such as the hydrogen index, spin-lattice relaxation time $T_1$, spin-spin relaxation time $T_2$, and/or self-diffusivity, the measurement of which is based on hydrogen NMR relaxometry. The content of this application is hereby incorporated by reference for all purposes.

One of the few differentiating features between OBM filtrate and crude oil is that OBMs are composed of base oils that are non-toxic, highly refined or synthesized hydrocarbons. Molecular weight and molecular structure are in general well controlled. Crude oil, on the other hand, is a random mix of variable-length and variable-structure hydrocarbons. From an NMR standpoint, many refined or synthesized base oils are characterized by simple, well defined monoexponential relaxation spectra (either $T_1$ or $T_2$). By contrast, the crude oil mix exhibits a spectrum of internal characteristic relaxation times and diffusivities. They manifest themselves as a spectrum of relaxation times. While this difference in relaxation time behavior between OBM filtrate and crude oil has been known in the field, see R. Kleinberg and H. Vinegar, "NMR Properties of Reservoir Fluids," The Log Analyst, vol. 37, no. 6 (November-December 1996), pp.20–32, it has not been applied in the context of downhole testing to separate the fluid phases and to tell at what point a sample of connate oil has been obtained in a downhole fluid sampler. It should be pointed out that the relaxation time parameters are described above in general terms (i.e., without specific reference to spin-lattice relaxation time $T_1$ or spin-spin relaxation time $T_2$), because it is known in the art that, in bulk fluids, $T_1$ is roughly equivalent to $T_2$, and any analysis based on differences in relaxation time behavior could involve either or both parameter(s).

SUMMARY OF THE INVENTION

It is an object of the present invention to provide a method and apparatus for using nuclear magnetic resonance (NMR) measurements to differentiate between oil based mud filtrate (OBM) and connate oil, based upon differences in relaxation time parameter behavior, during subsurface exploration.

In a preferred embodiment, the method of the present invention comprises: providing a sample of formation fluid; performing an NMR experiment on a sample of formation fluid; and processing the NMR signals obtained in the experiment to differentiate OBM filtrate signal contribution from connate oil signal contribution. In a specific embodiment of the present invention, the method comprises the steps of: introducing a sample of formation fluid into an NMR measurement chamber; polarizing hydrogen nuclei of the fluid sample by applying a static magnetic field; inducing magnetic resonance at a resonance frequency proportional to the static magnetic field; and recording an echo-decay curve by means of a Carr-Purcell-Meiboom-Gill (CPMG) pulse sequence. In this embodiment, hydrogen nuclei of the fluid sample are polarized by a static magnetic field of approximately 1000 Gauss and magnetic resonance is induced at a resonance frequency of approximately 4.2 MHZ.

In accordance with another aspect of the present invention, the method further comprises the steps of: repeating the steps of providing a sample, performing an NMR experiment on the sample and processing the NMR signals; comparing the processed data with that generated for previous fluid samples to determine when the reservoir fluid consists entirely of connate oil. In a specific embodiment the method further comprises the step of collecting a fluid sample for further analysis. In a specific embodiment, the method may also further comprise displaying the processing results to an operator.

In a preferred embodiment of the present invention, the step of processing NMR signals, described above, comprises determining an NMR relaxation time parameter for a current fluid sample. This parameter may be either the spin-lattice relaxation time, $T_1$, or the spin-spin relaxation time, $T_2$. It can be appreciated by one skilled in the art that, in bulk fluids, these two relaxation time parameters are roughly equivalent, so either or both may be employed in the method and apparatus of the present invention. In this embodiment, the step of "comparing" described above comprises taking the difference of relaxation time parameters calculated for successive fluid samples. A small difference between relaxation time parameters of successive fluid samples will be followed by a distributional analysis. It can be appreciated by one of ordinary skill in the art that this distributional analysis may be performed in either the time domain or the relaxation spectrum domain. The transform from time domain to relaxation spectrum domain is well known in the art and is described, for example, in U.S. Pat. No. 5,517,115, which is hereby incorporated by reference. It will also be obvious to one skilled in the art that, at some point during the analysis, one or more statistical parameters for a distribution (e.g. mean, variance, skew) may be determined for a distribution of relaxation time associated with a particular fluid sample.

In one aspect of the present invention, the distributional analysis described above is performed in the time domain and a uni-exponential model is fitted to the detected echo-decay curve. The average of squared differences between data points on the echo-decay curve and the uni-exponential model is computed and recorded as a fitting error ($chi^2$). An increase in fitting error denotes a shift in fluid sample content from OBM filtrate to connate oil.

In another aspect of the present invention, the processing of data is performed directly in the relaxation spectrum domain. In this embodiment, the half-amplitude of the distribution of relaxation times is measured and recorded. An increasingly broad half-amplitude distribution denotes a shift in fluid sample content from OBM filtrate to connate oil.

In a preferred embodiment, the apparatus of the present invention comprises: a vessel for containing fluid samples; an NMR testing module capable of performing an NMR experiment on a sample of formation fluid; an NMR signal processor to differentiate OBM filtrate signal contribution from connate oil signal contribution; and an output device for monitoring processor results. In accordance with a preferred embodiment of the invention, the NMR testing module capable of performing an NMR experiment further comprises: a means for polarizing hydrogen nuclei of a fluid sample by applying a static magnetic field; a means for inducing magnetic resonance at a frequency proportional to the static magnetic field; and a means for recording an echo decay curve by means of a CPMG pulse sequence.

In another preferred embodiment of the invention, the processor and output device of the apparatus is a computer system. In this embodiment the computer system comprises: a central processing unit (CPU), memory unit(s), one or more storage devices, and one or more input/output devices. A system bus is provided for communicating between the above elements.

The method and apparatus of the invention can thus signal the user as to when a sample of crude production can be collected and brought to the surface, thereby increasing the overall efficiency of both the testing and drilling processes.

BRIEF DESCRIPTION OF THE DRAWINGS

The present invention will be understood and appreciated more fully from the following detailed description, taken in conjunction with the drawings in which.

DETAILED DESCRIPTION OF THE PREFERRED EMBODIMENTS

Figure 1:
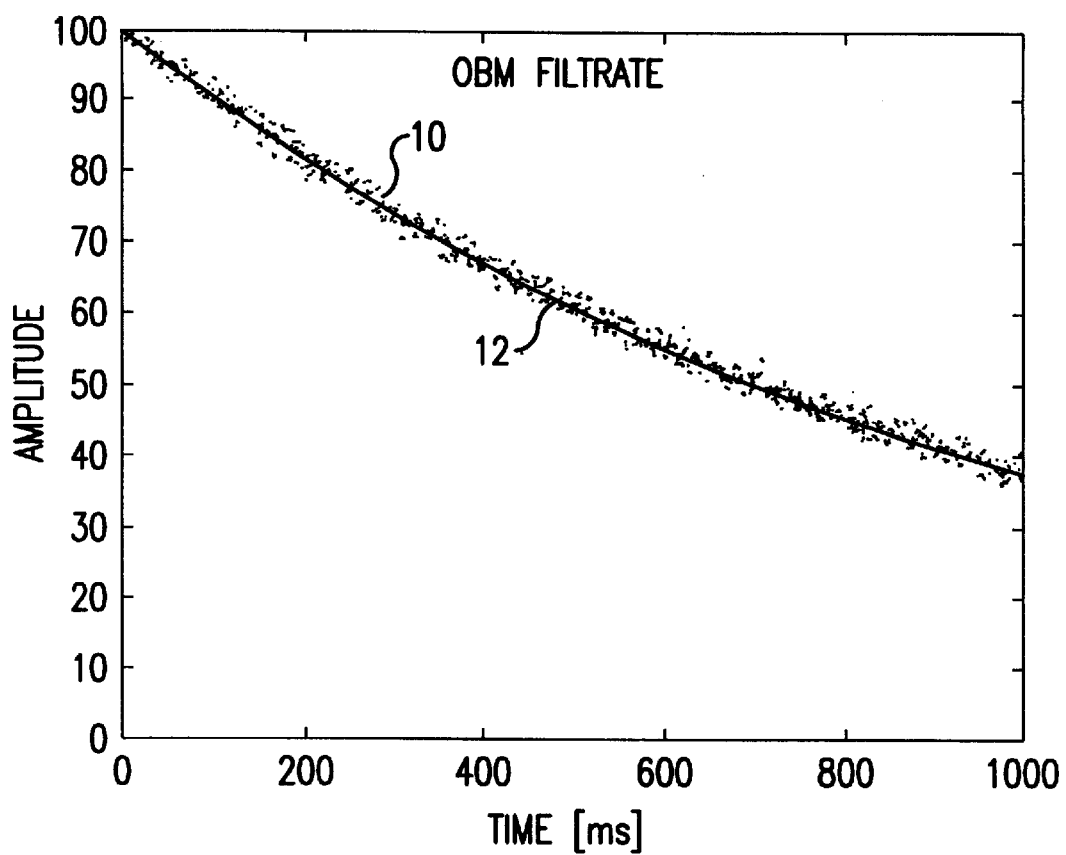
FIG. 1 is a plot of simulated CPMG data from OBM filtrate with $T_2$=1000ms, best uni-exponential fit, and best multi-exponential fit.

Reference is now made to FIG. 1 which illustrates a plot of simulated CPMG data from OBM filtrate with $T_2$=1000ms. Data points 10 from a best uni-exponential fit and data points 12 from a best multi-exponential fit are plotted on the same set of axes. As is evident from FIG. 1, there is no significant difference between the two models; fitting the decay curve with a uni-exponential test function or a multi-exponential model essentially produces the same result. Collecting NMR data, constructing uni-exponential and multi-exponential models, and other NMR signal processing is known in the art and is described, for example, in U.S. Pat. Nos. 5,212,447; 5,280,243; 5,309,098; 5,412,320; 5,517,115; and 5,557,200 to the assignee of the present application, the relevant portions of which are hereby incorporated by reference.

Figure 2:
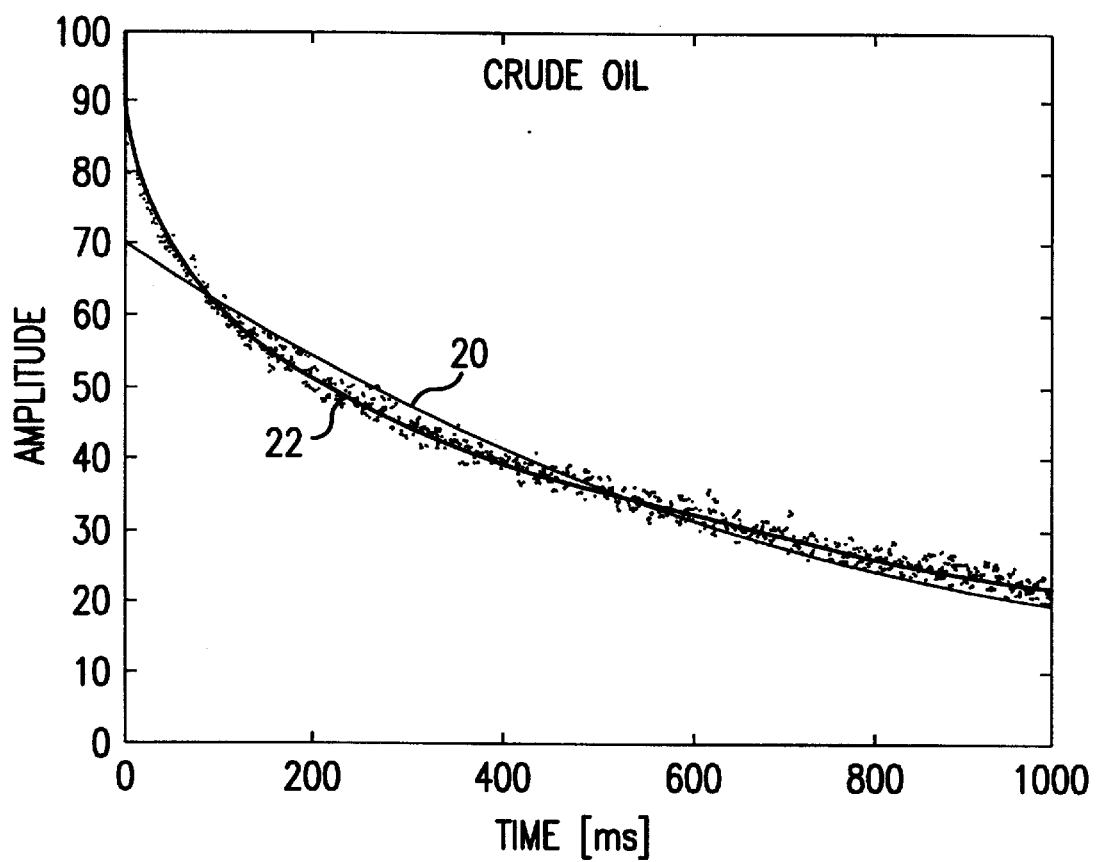
FIG. 2 is a plot of simulated CPMG data from crude oil with $T_2$'s between 10 and 1000ms, best uni-exponential fit, and best multi-exponential fit.

Reference is now made to FIG. 2 which illustrates a plot of simulated CPMG data from crude oil with $T_2$'s between 10 and 1000ms. Again, data points 20 from a best uni-exponential fit and data points 22 from a best multi-exponential fit are plotted on the same coordinate system. As is evident from FIG. 2, and as can be appreciated by one skilled in the art, there is a strong difference between the two models. Again, it should be pointed out that while FIG. 1 and FIG. 2 are based upon measurements of the spin-spin relaxation time $T_2$, of the fluid, in bulk fluids, either spin-lattice relaxation time, $T_1$, or spin-spin relaxation time, $T_2$, may be employed in the method and apparatus of the present invention.

Figure 3:
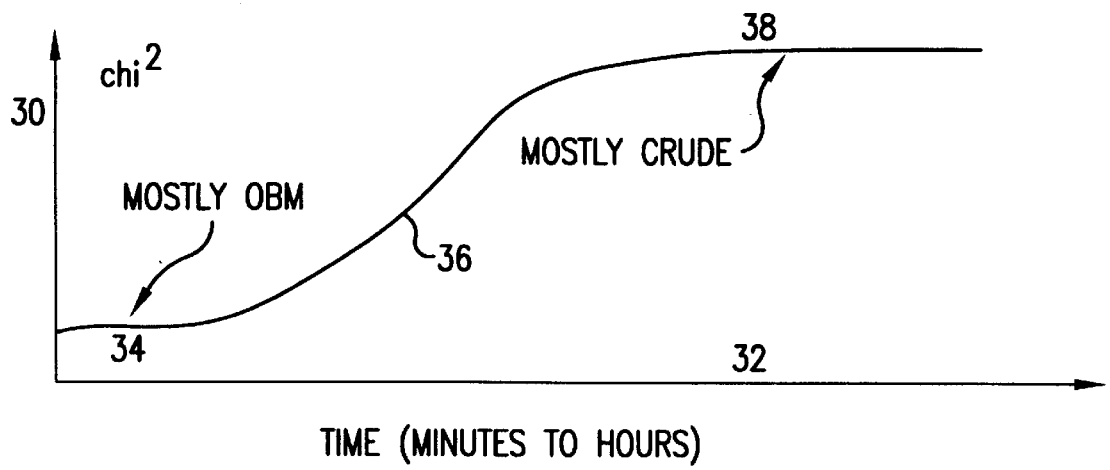
FIG. 3 is a plot of the expected behavior of fitting error $chi^2$ as a function of time.

Reference is now made to FIG. 3, which is a plot of the behavior of the fitting error, $chi^2$, as a function of time. In a preferred embodiment of the present invention, such a plot would normally be created only after calculating a small difference between relaxation time parameters for successive fluid samples. Fitting error $chi^2$ is plotted along the y-axis 30 and time, measured in minutes to hours, is plotted along the x-axis 32. Segment 34 of the plot represents a period of low fitting error, when mostly OBM filtrate is produced from the formation. Segment 36 of the plot represents an increase in the fitting error $chi^2$, and indicates an increase in the crude oil content of the sample. Segment 38 of the plot represents a time when the fitting error has risen and stabilized on a new plateau, characteristic for the $T_2$ spectrum of a crude oil. At this time, the formation fluid is determined to consist mostly of crude oil.

FIG. 1, FIG. 2, and FIG. 3 all represent an analysis performed in accordance with the present invention in the time domain.

Figure 4:
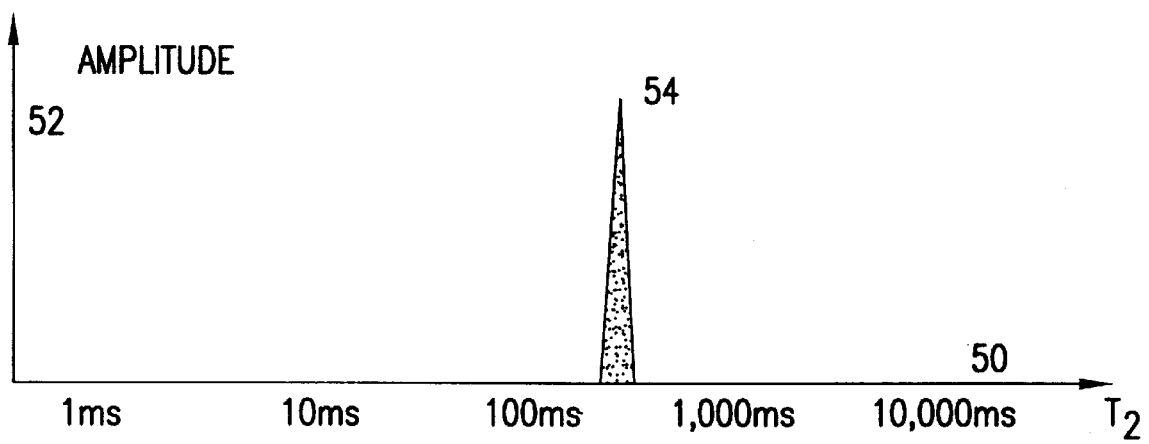
FIG. 4 is a plot of relaxation spectrum representative of all OBM base oils measured.

Reference is now made to FIG. 4, which illustrates a plot of a relaxation spectrum representative of all OBM base oils measured. Once again, this type of plot would be created ordinarily when the calculated difference between relaxation time parameters for successive fluid samples is sufficiently small. Spin-spin relaxation time $T_2$, measured in milliseconds, is plotted along the x-axis 50 and amplitude is plotted along the y-axis 52. Since the synthetic base oils measured are composed of simple $C_{16}/C_{18}$ hydrocarbon chains with identical molecular correlation times, a single peak 54 is observed in the NMR $T_2$ relaxation spectrum. The position of peak 54 can change with temperature, but its characteristic shape does not.

Figure 5:
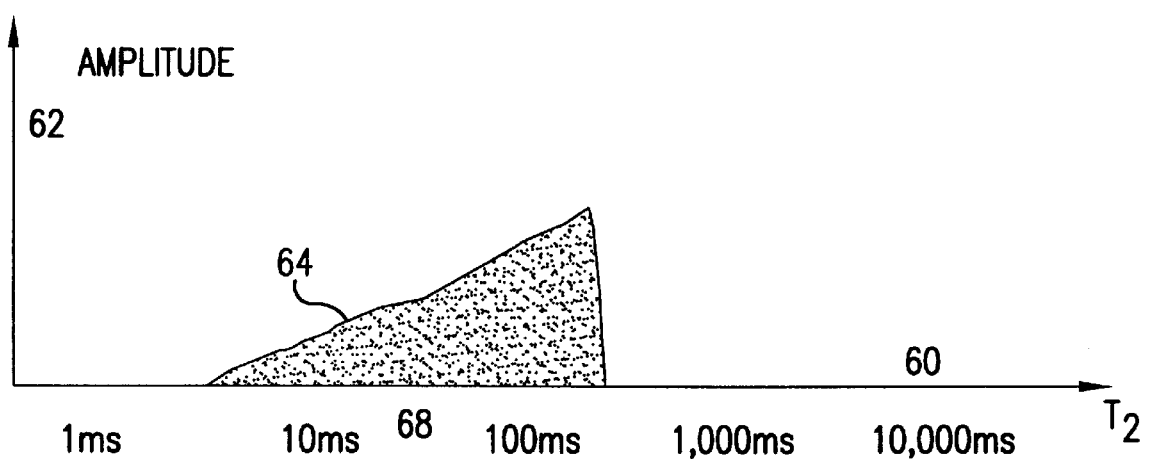
FIG. 5 is a typical relaxation spectrum plot of a crude oil.

Reference is now made to FIG. 5, which is a plot of a relaxation spectrum representative of a crude oil. Spin-spin relaxation time, $T_2$, measured in milliseconds, is plotted along the x-axis 60 and amplitude is plotted along the y-axis 62. The long "tail" 64 towards short relaxation times is due to the presence of long hydrocarbon chains (e.g., asphaltenes) with long molecular correlation times. The position and particular shape of the distribution is of less importance than its width 66 compared to peak 54 in FIG. 4.

FIG. 4 and FIG. 5 represent an analysis performed in accordance with the present invention in the $T_2$ relaxation domain. Again, it is known in the art that, when dealing with bulk fluids, this type of analysis could also be performed in the spin-lattice (i.e., $T_1$) relaxation domain.

Figure 6A:
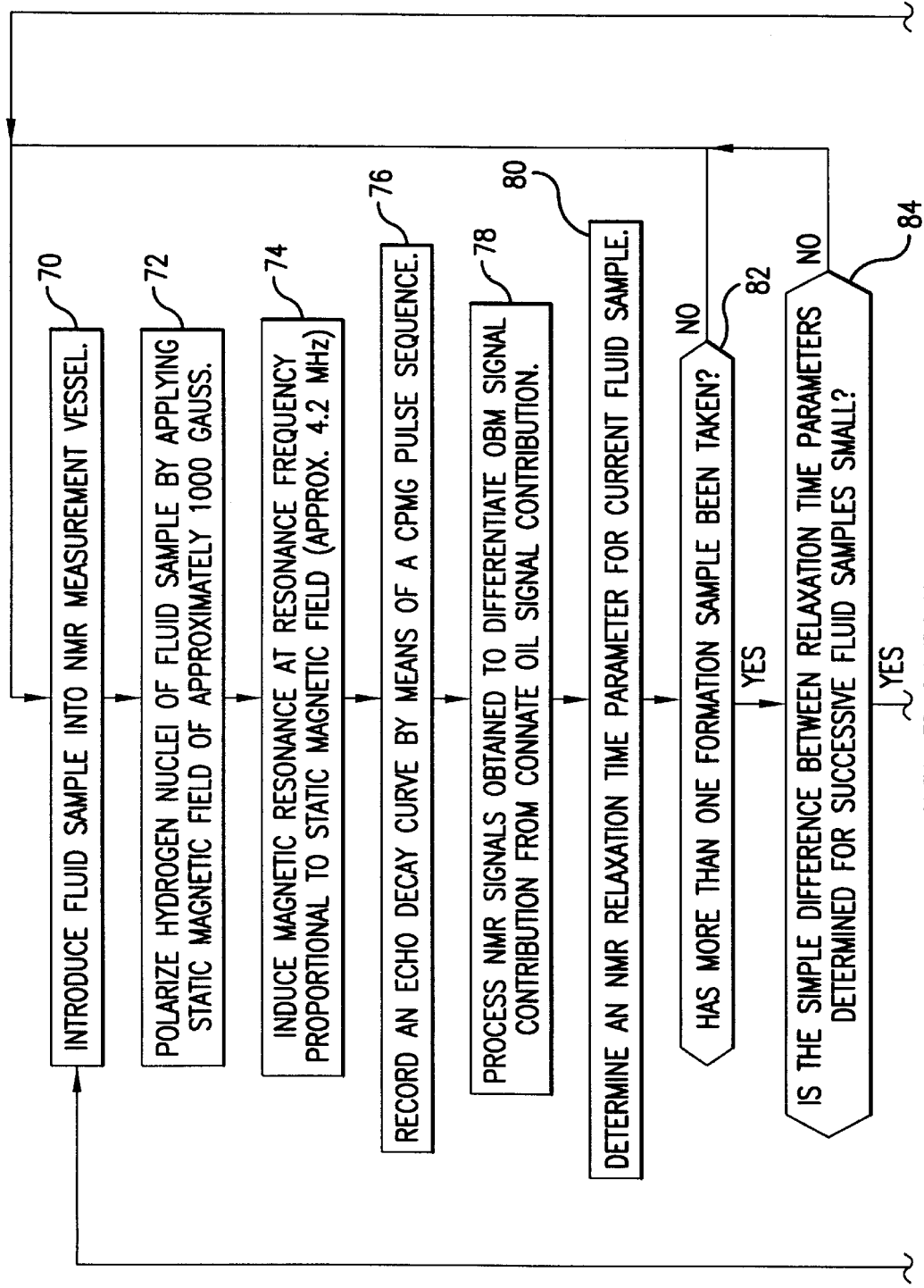
FIGS. 6A and 6B is a flowchart detailing the steps for practicing different preferred embodiments of the invention.
Figure 6B:
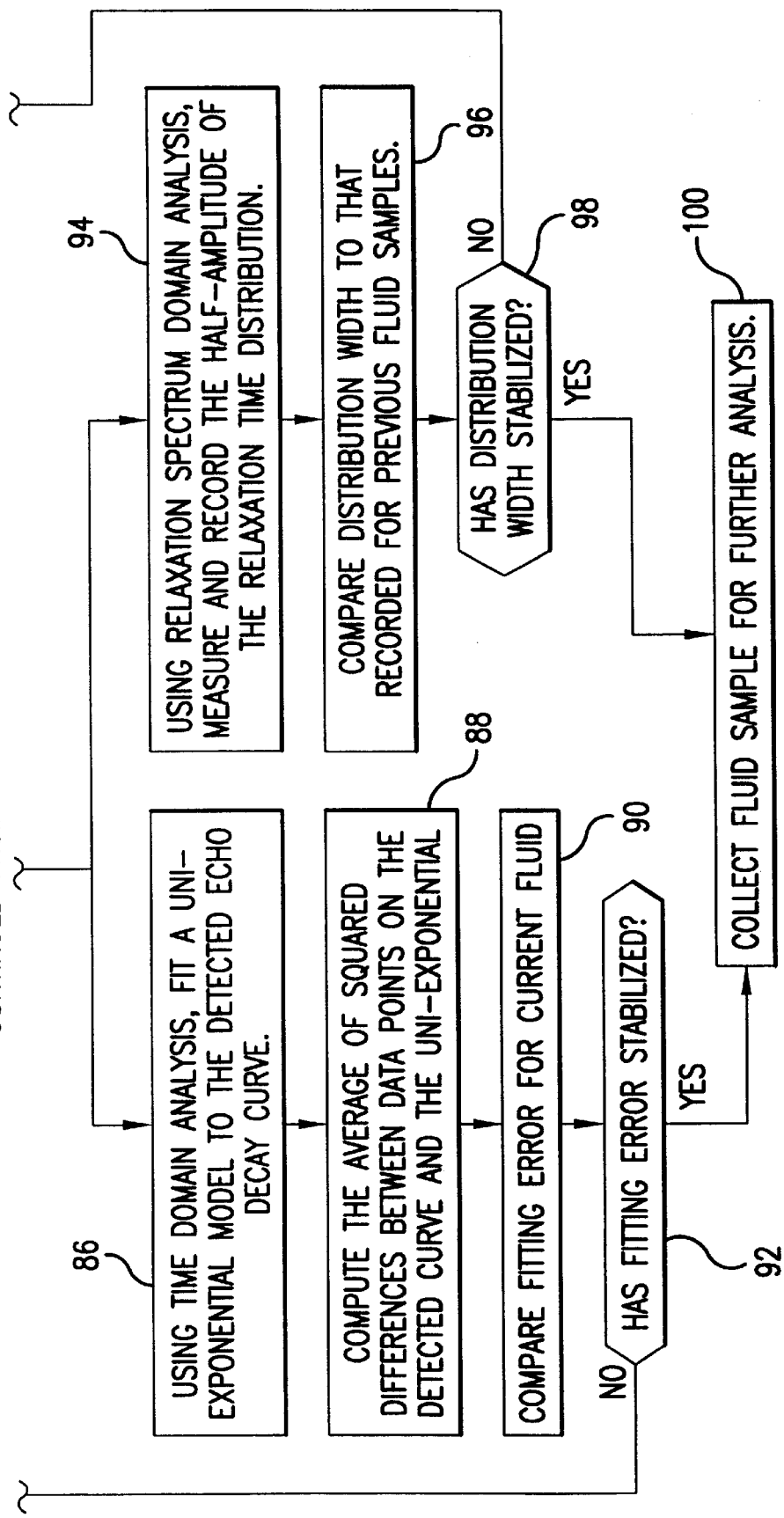

Reference is now made to FIGS. 6A and 6B, which are a flowchart detailing the steps for practicing different preferred embodiments of the present invention. A sample of formation fluid is introduced into a vessel (or NMR measurement chamber) in step 70. This aspect of the method is disclosed in detail in the co-pending application Ser. No. 08/996,716, which is incorporated herein by reference. The hydrogen nuclei of the fluid sample are polarized by application of a static magnetic field in step 72. In a preferred embodiment this field is approximately 1000 Gauss. In step 74, magnetic resonance is induced at a resonance frequency proportional to the static magnetic field of step 72, which in a preferred embodiment is approximately 4.2 MHz. An echo decay curve is recorded by means of a CPMG pulse sequence in step 76. The NMR signals are processed to differentiate OBM filtrate signal contribution from connate oil signal contribution in step 78. In a preferred embodiment, in step 80, this signal processing comprises determining an NMR relaxation time parameter for a current fluid sample. At this point, in step 82, if only one fluid sample has been taken, steps 70 through 80 are repeated for a another sample. In step 84, if multiple samples have been taken, and the simple difference between relaxation time parameters associated with successive fluid samples is small, a distributional analysis is performed. In the alternative, if the difference between relaxation time parameters for successive fluid samples is large, steps 70 through 84 are repeated for another fluid sample.

At this point, those skilled in the art will realize that the analysis can be performed either in the time domain or in the relaxation spectrum domain. An example of $T_2$ spectrum analysis is discussed in U.S. Pat. No. 5,517,115 which is incorporated herein for all purposes.

If time domain analysis is selected, in step 86, a uni-exponential model is fit to the detected echo decay curve. The average of squared differences between data points on the detected curve and the uni-exponential model is computed and recorded as the fitting error, $chi^2$, in step 88. In step 90, the fitting error computed for the current fluid sample is compared to that computed for the previous fluid samples. In step 92, if the user is not satisfied that fitting error has stabilized, or if only one fluid sample has been taken, steps 70 through 90 are repeated for another fluid sample. If the user is satisfied that the fitting error has stabilized, he will proceed to step 100 and collect a fluid sample for further analysis. It will be appreciated that the observation of the fitting error can be automated in alternate embodiments and its stabilization can be determined, for example, by measurements of the slope of the fitting curve. Alternative embodiments will be readily recognized by those skilled in the art.

In the alternative, returning to step 84, if processing is selected in the relaxation spectrum domain, in step 94, the half-amplitude of the relaxation time distribution is measured and recorded. In step 96, the half-amplitude distribution width recorded for the current sample is compared to that for previous fluid samples. In step 98, if the user is not satisfied that the distribution width has stabilized, or if only one fluid sample has been taken, steps 70 through 84 and steps 94 and 96 are repeated for another fluid sample. If the user is satisfied that the fitting error has stabilized, he will proceed to step 100 and collect a fluid sample. The process can be automated to avoid human input, if necessary.

Figure 7:
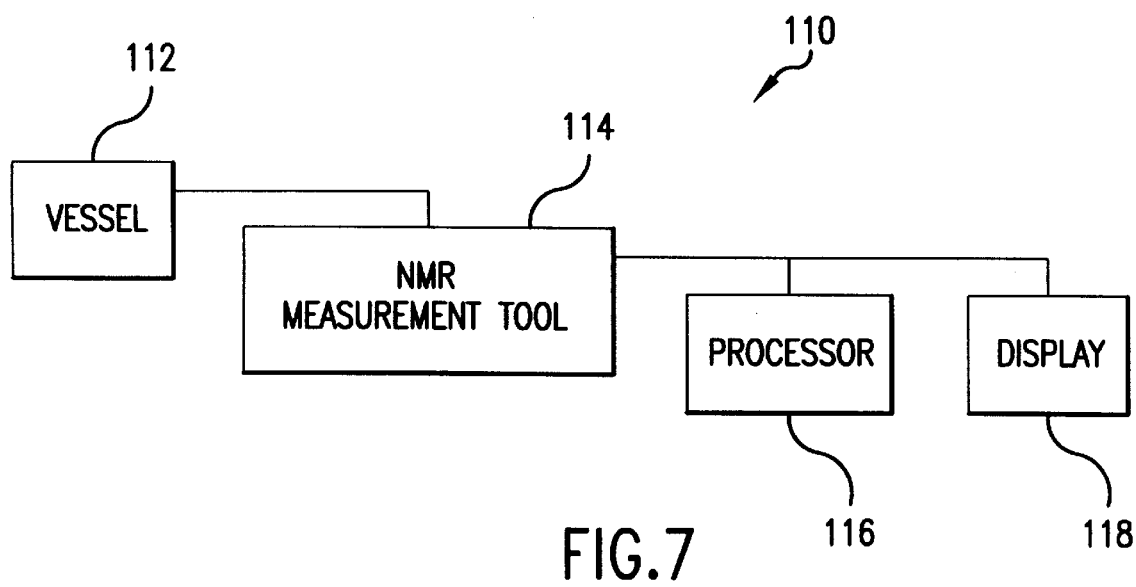
FIG. 7 is a schematic representation of an apparatus in accordance with the present invention.

Reference is now made to FIG. 7, which illustrates, in a schematic form, an apparatus 110 in a preferred embodiment of the present invention. The apparatus comprises a vessel 112 for containing fluids, an NMR testing module 114 capable of performing an NMR experiment on the fluid sample contained within the vessel 112, a processor 116 to differentiate NMR signals, and an output device 118, such as a display, for monitoring the results. The design and operation of the vessel and the testing module are described in detail in U.S. patent application Ser. No. 08/996,716, filed Dec. 23, 1997, which is incorporated herein for all purposes. The operation of processor 116 is described above with reference to FIG. 6. It can be appreciated that the processor can be implemented in hardware or software, depending on the particular application.

Figure 8:
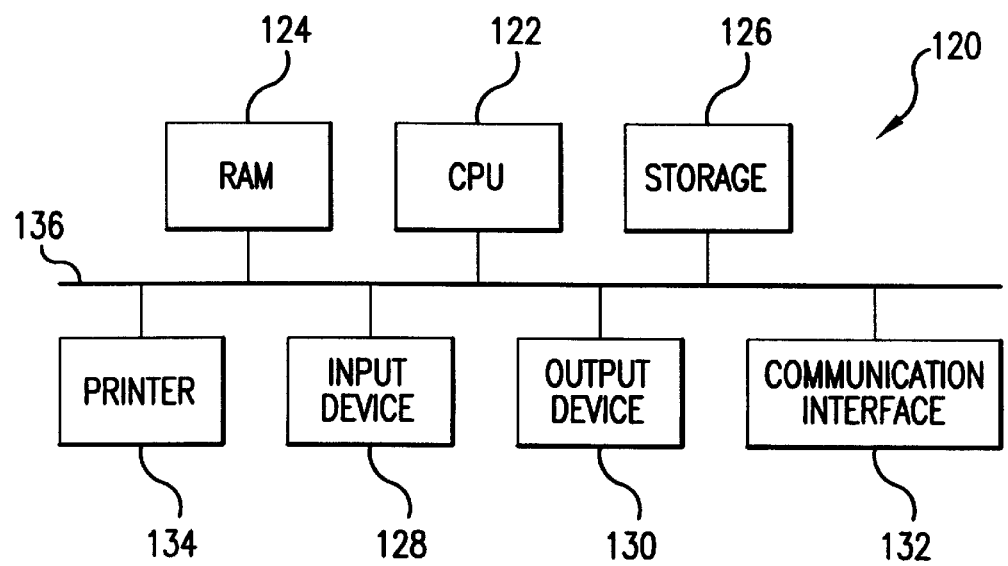
FIG. 8 is a block diagram of a representative computer system which may serve as the processor and output device of the apparatus in a specific embodiment of the present invention.

Reference is now made to FIG. 8, which illustrates, in block diagram form, a representative computer system 120, which may serve as the processor and display elements of the apparatus of the present invention. Computer system 120 includes a central processing unit (CPU) 122, memory unit 124, one or more storage devices 126, and one or more input/output devices 128. In a preferred embodiment the system comprises a display 130, a communication interface 132, and a printer 134. A system bus 136 is provided for communicating between the above elements.

While the present invention has been described with reference to the preferred embodiments, those skilled in the art will recognize that numerous variations and modifications may be made without departing from the scope of the present invention. Accordingly, it should be understood that the embodiments of the invention described above are not intended as limitations on the scope of the invention, which is defined only by the following claims.

What is claimed is:

1. A method for differentiating oil based mud (OBM) filtrate from connate oil in a borehole of a geologic formation comprising:

(a) providing a downhole sample of formation fluid in a vessel;

(b) performing a downhole nuclear magnetic resonance (NMR) experiment on the sample of formation fluid in the vessel; and (c) processing NMR signals obtained in said experiment to differentiate OBM filtrate signal contribution from connate oil signal contribution.

2. The method of claim 1 further comprising the steps of:

(d) repeating steps (a) through (c) for additional fluid samples;

(e) comparing the processed data with that generated for previous fluid samples to determine when the formation fluid consists substantially of connate oil; and (f) collecting a fluid sample for further analysis.

3. The method of claim 2 wherein said processing comprises determining an NMR relaxation time parameter for a current fluid sample.

4. The method of claim 3 wherein said NMR relaxation time parameter is spin-lattice relaxation time $T_1$.

5. The method of claim 3 wherein said NMR relaxation time parameter is spin-spin relaxation time $T_2$.

6. The method of claim 3 wherein said step of comparing further comprises taking the difference of relaxation time parameters calculated for successive fluid samples.

7. The method of claim 6 wherein a small difference between the relaxation time parameters determined for successive fluid samples is followed by a distributional analysis.

8. The method of claim 7 wherein said distributional analysis comprises determining one or more parameters associated with the distribution.

9. The method of claim 7 wherein said distributional analysis is performed in the time domain.

10. The method of claim 9 wherein step (b) comprises detecting an NMR echo decay curve, and a uni-exponential model is fitted to the detected echo decay curve.

11. The method of claim 10 wherein the average of squared differences between data points on the echo decay curve and the uni-exponential model is computed and recorded as a fitting error.

12. The method of claim 11 wherein an increase in said fitting error denotes a shift in fluid sample content from OBM filtrate to connate oil.

13. The method of claim 7 wherein said distributional analysis is performed in the relaxation spectrum domain.

14. The method of claim 13 wherein the half-amplitude of the distribution of relaxation times is measured and recorded.

15. The method of claim 14 wherein an increasingly broad half-amplitude distribution denotes a shift in fluid sample content from OBM filtrate to connate oil.

16. The method of claim 2 further comprising determining one or more parameters of a distribution for a relaxation time associated with said NMR experiment performed on said fluid sample.

17. The method of claim 2 wherein step (d) further comprises creating a plot of a fitting error versus time.

18. The method of claim 1 wherein step (b) comprises:

(1) introducing a sample of formation fluid into an NMR measurement chamber;

(2) polarizing hydrogen nuclei of the fluid sample by applying a static magnetic field;

(3) inducing magnetic resonance at a resonance frequency proportional to the static magnetic field; and (4) recording an echo decay curve.

19. The method of claim 18 wherein hydrogen nuclei of the fluid sample are polarized by a static magnetic field of approximately 1000 Gauss.

20. The method of claim 18 wherein magnetic resonance is induced at a resonance frequency of approximately 4.2 MHZ.

21. The method of claim 1 further comprising displaying the processed NMR signals in step (c) to an operator.

22. An NMR apparatus for differentiating between oil-based mud (OBM) filtrate and connate oil in a borehole, comprising:

(a) a vessel for containing formation fluids, said vessel being adapted to withstand borehole environment conditions;

(b) an NMR testing module capable of performing a downhole NMR experiment on a sample of formation fluid within the vessel; and (c) an NMR signal processor to operative to differentiate OBM filtrate signal contribution from connate oil signal contribution.

23. The apparatus of claim 22 wherein said NMR testing module capable of performing an NMR experiment further comprises:

(1) a means for polarizing hydrogen nuclei of said fluid sample by applying a static magnetic field;

(2) a means for inducing magnetic resonance at a resonance frequency proportional to the static magnetic field; and (3) a means for recording an echo decay curve.

24. The apparatus of claim 22 further comprising an output device for monitoring processor results.

25. The apparatus of claim 24 wherein said processor and output device is a computer system.

26. The apparatus of claim 25 wherein said computer system comprises:

(a) a central processing unit (CPU);

(b) one or more storage devices;

(c) an input/output device; and (d) a system bus for communicating between the above elements.

27. A method for processing formation fluids in a borehole of a geologic formation comprising:

(a) providing at least two downhole samples of formation fluid by means of a vessel adapted for use in borehole environment conditions;

(b) performing a downhole nuclear magnetic resonance (NMR) experiment on the provided formation fluid samples;

(c) determining NMR relaxation properties for the formation fluid samples;

(d) comparing the determined NMR relaxation properties for at least two successive formation fluid samples; and (e) providing an indication when the difference between NMR relaxation properties for said at least two successive formation fluid samples is below certain threshold.

28. The method of claim 27 wherein said indication is used to determine a point in time when successive formation fluid samples change from oil based mud (OBM) filtrate to connate oil.

29. The method of claim 27 wherein step (b) comprises recording an echo decay signal using a Carr-Purcell-Meiboom-Gill (CPMG) pulse sequence.

30. The method of claim 29 further comprising, following step (e), the step of fitting an NMR relaxation signal model corresponding to at least one fluid phase to the recorded echo decay to determine a fitting error measure.

31. The method of claim 30 wherein the step of fitting an NMR relaxation model is performed in the time domain.

32. The method of claim 30 wherein the step of fitting an NMR relaxation model is performed in the relaxation spectrum domain.

33. The method of claim 30 wherein an operator decides whether to use subsequent formation fluid samples based on the determined fitting error measure.

34. The method of claim 30 wherein a decision as to whether to use subsequent formation fluid samples is made automatically based on the determined fitting error measure.

* * * * *